(12) United States Patent
Chang et al.

(10) Patent No.: US 10,312,090 B2
(45) Date of Patent: Jun. 4, 2019

(54) PATTERNING METHOD

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Chieh-Te Chen, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/003,058

(22) Filed: Jun. 7, 2018

(65) Prior Publication Data
US 2019/0035631 A1 Jan. 31, 2019

(30) Foreign Application Priority Data
Jul. 28, 2017 (CN) .......................... 2017 1 0628501

(51) Int. Cl.
*H01L 21/311* (2006.01)
*H01L 21/033* (2006.01)
*H01L 27/108* (2006.01)

(52) U.S. Cl.
CPC ...... *H01L 21/0338* (2013.01); *H01L 21/0332* (2013.01); *H01L 21/0335* (2013.01); *H01L 21/0337* (2013.01); *H01L 27/10894* (2013.01)

(58) Field of Classification Search
None
See application file for complete search history.

(56) References Cited

U.S. PATENT DOCUMENTS

| 6,498,105 | B1 | 12/2002 | Kim |
| 7,429,536 | B2 | 9/2008 | Abatchev |
| 7,572,572 | B2 | 8/2009 | Wells |
| 7,732,343 | B2 | 6/2010 | Niroomand |
| 8,111,921 | B2 | 2/2012 | Hsu |

(Continued)

OTHER PUBLICATIONS

Chen, Title of Invention: Method for Forming Semiconductor Structure, U.S. Appl. No. 15/613,395, filed Jun. 5, 2017.

*Primary Examiner* — Hung K Vu
(74) *Attorney, Agent, or Firm* — Winston Hsu

(57) ABSTRACT

A patterning method is disclosed. A substrate having a hard mask layer and a first material layer formed thereon is provided. The first material layer is patterned into first array patterns and first peripheral patterns. The first array patterns are further transferred into first spacer patterns. Subsequently, a planarization layer and a second material layer are successively formed on the substrate. The second material layer is patterned into second array patterns and second peripheral patterns. The second array patterns are further transferred into second spacer patterns. The second spacer patterns partially overlap the first spacer patterns. The second peripheral patterns do not overlap the first peripheral pattern. The first spacer patterns not overlapped by the second spacer patterns are removed to obtain third array patterns. The hard mask layer is then etched using the third array patterns, the second peripheral patterns and the first peripheral patterns as an etching mask.

16 Claims, 18 Drawing Sheets

(56) References Cited

U.S. PATENT DOCUMENTS

| | | | |
|---|---|---|---|
| 8,546,202 B2 | 10/2013 | Tung | |
| 2010/0243161 A1* | 9/2010 | Tran | H01L 21/0337 156/345.3 |
| 2013/0210228 A1* | 8/2013 | Tran | H01L 21/0337 438/675 |
| 2013/0244436 A1* | 9/2013 | Sandhu | B82Y 10/00 438/702 |

\* cited by examiner

PATTERNING METHOD

BACKGROUND OF THE INVENTION

1. Field of the Invention

The present invention relates generally to the field of integrated circuit manufacturing. More particularly, the present invention relates to a patterning method for forming integrated circuit features on a semiconductor substrate with improved manufacturability.

2. Description of the Prior Art

In semiconductor manufacturing, the design patterns of an integrated circuit are transferred to a semiconductor substrate by a patterning process. A conventional patterning process, such as a photolithography-etching process usually includes transferring the design patterns from a photomask to a mask layer on a semiconductor substrate to form a patterned mask layer by performing a photolithography process. After that, an etching process is carried out, using the patterned mask layer as an etching mask to etch the semiconductor substrate thereby the design patterns is further transferred to the semiconductor substrate.

In advanced semiconductor technology, as the demand for better device performance and higher degree of integration, the dimensions of integrated circuits continue to shrink and the manufacturing of integrated circuits has become more and more difficult. The patterning process for accurately forming the design patterns in the semiconductor substrate is one of the bottlenecks confronted during advanced technology development. The situation is even more challenging for the integrated circuits incorporating different types of dense patterns. Therefore, there is always a need in this industry to provide a patterning method with improved manufacturability.

SUMMARY OF THE INVENTION

It is one object of the invention to provide a method for forming integrated circuit features on a semiconductor substrate. The method provided by the present invention may be used to form different types of dense patterns on a semiconductor substrate with simplified process steps and improved manufacturability.

According to one aspect of the invention, a patterning method is disclosed. A substrate having a hard mask layer formed thereon is provided. An array region and a peripheral region are defined on the substrate. A first material layer is formed on the hard mask layer and is then patterned to form first array patterns in the array region and first peripheral patterns in the peripheral region. A first self-aligned reverse patterning (SARP) process is then performed to transfer the first array pattern into first spacer patterns. Subsequently, a planarization layer is formed on the substrate in a blanket manner and completely covering the first spacer patterns and the first peripheral patterns. A second material layer is formed on the planarization layer and is then patterned into second array patterns in the array region and second peripheral patterns in the peripheral region. A second self-aligned reverse patterning (SARP) process is performed to transfer the second array patterns into second spacer patterns. The second spacer patterns partially vertically overlap the first spacer patterns and the second peripheral patterns do not vertically overlap the first peripheral pattern along the vertical direction. Afterwards, using the second spacer patterns and the second peripheral patters as an etching mask, the planarization layer is etched until portions of the first spacer patterns not overlapped by the second spacer patterns and the first peripheral patterns are exposed. The exposed portions of the first spacer patterns are then removed to form third array patterns. Thereafter, using the third array patterns, the second peripheral patterns and the first peripheral patterns as an etching mask, the hard mask layer is etched thereby forming a patterned hard mask layer.

According to an embodiment, the first self-aligned reverse patterning (SARP) process includes forming a first covering layer covering the first peripheral patterns, forming a first spacer material layer conformally covering the first array patterns and the first covering layer, etching the first spacer material layer to form first spacer patterns on sidewalls of the first array patterns, and removing the first array patterns and the first covering layer.

According to an embodiment, the second self-aligned reverse patterning (SARP) process includes forming a second covering layer covering the second peripheral patterns, forming a second spacer material layer conformally covering the second array patterns and the second covering layer, etching the second spacer material layer to form second spacer patterns on sidewalls of the second array patterns, and removing the second array patterns and the second covering layer.

According to an embodiment, the patterned hard mask layer may be used as an etching mask to etch a target layer on the substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles.

DETAILED DESCRIPTION

Figure 1:
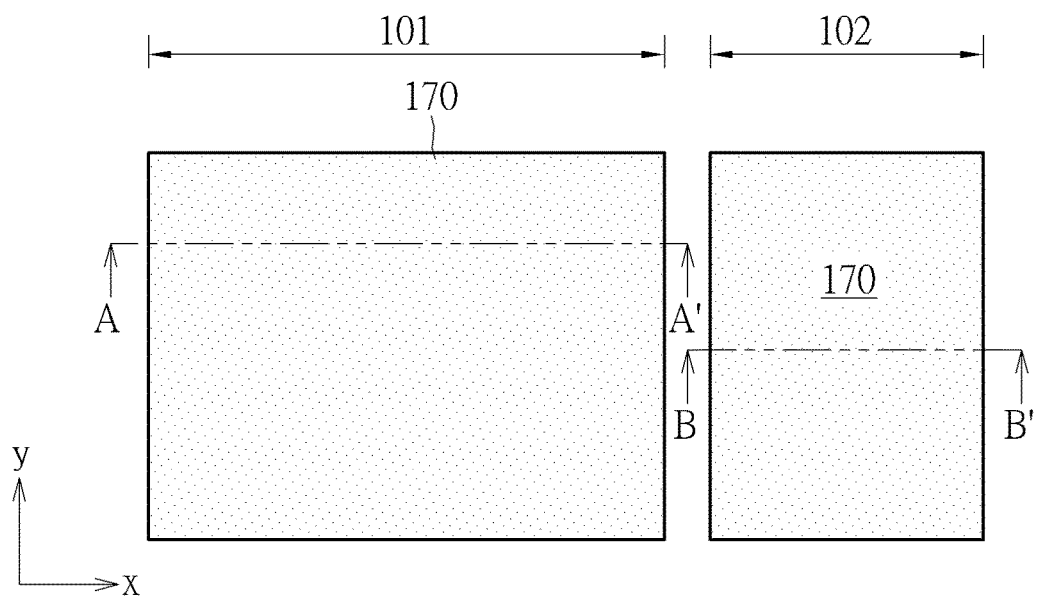
FIG. 1 to FIG. 18 are schematic diagrams sequentially illustrating a patterning method for forming semiconductor features on a semiconductor substrate according to one embodiment of the invention.
Figure 1:
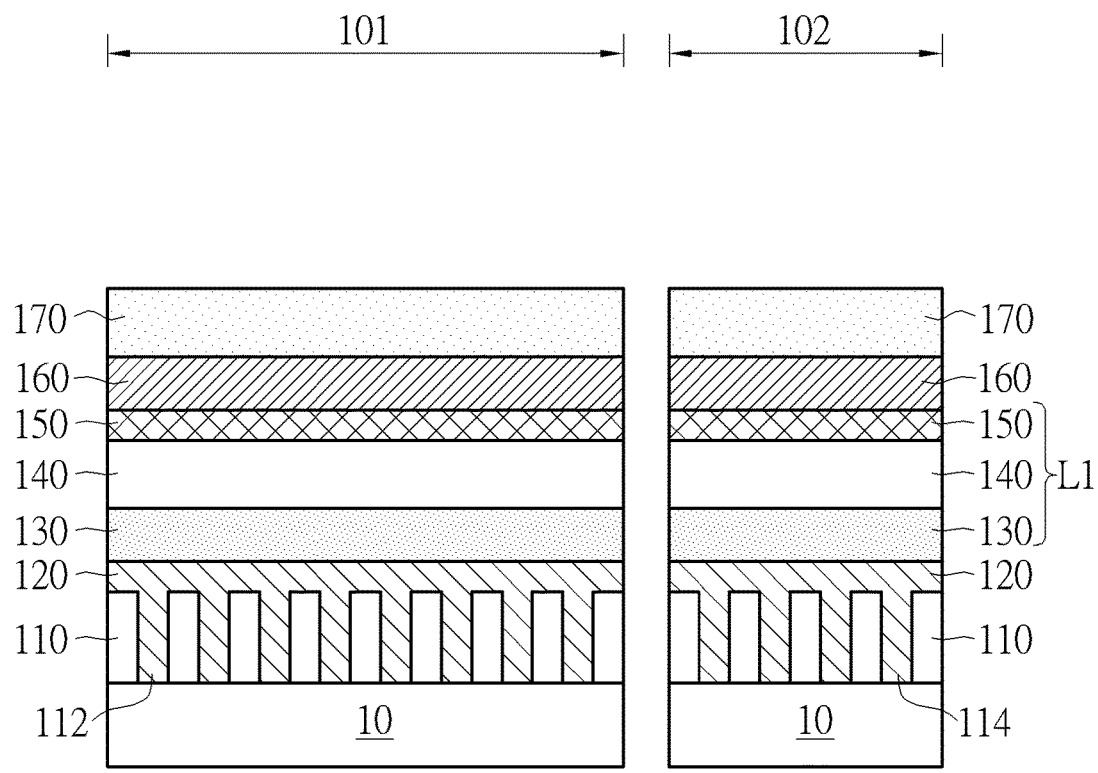

In the following detailed description, reference is made to the accompanying drawings which form a part hereof, and in which is shown, by way of illustration of specific embodiments in which the invention may be practiced. These embodiments are described in sufficient detail to enable those skilled in the art to practice the invention. Other embodiments may be utilized and that structural, logical and electrical changes may be made without departing from the spirit and scope of the present invention.

One or more implementations of the present invention will now be described with reference to the attached drawings, wherein like reference numerals are used to refer to like elements throughout, and wherein the illustrated structures are not necessarily drawn to scale.

The term "substrate" used herein include any structure having an exposed surface onto which a layer is deposited according to the present invention to form the integrated circuit features. The term substrate is understood to include semiconductor wafers, but not limited thereto. The term substrate is also used to refer to a semiconductor construction during processing, and may include other layers that have been fabricated thereupon.

During the descriptions herein, various "regions" defined on the semiconductor substrate in which the semiconductor features are fabricated are mentioned. These regions may be used to designate areas having certain types of devices or materials. These regions may be used to conveniently describe areas that include similar devices and should not limit the scope or spirit of the described embodiments. It should be understood that these regions may exist anywhere on the semiconductor substrate and furthermore that the regions may not be mutually exclusive. That is, in some embodiments, portions of one or more regions may overlap. Any number of regions may exist on the semiconductor substrate and should not limit the scope or spirit of the described embodiments.

The concept of "pitch" may be used to describe one aspect of the sizes of the features in an integrated circuit. Pitch is defined as the distance between identical points in two neighboring features, such as features in an array, which are typically arranged in a repeating pattern. As a result, pitch may be viewed as the sum of the width of a feature and of the width of the space on one side of the feature separating that feature from a neighboring feature.

The present invention pertains to a patterning method for integrally forming different types of dense patterns on a semiconductor substrate. In an exemplary embodiment, as will be described in more detail below, a patterning method for integrally forming the storage node (SN) pads and the contact plug pads respectively in an array region and a peripheral region of a semiconductor substrate of a dynamic random access memory (DRAM) device is disclosed.

Please refer to FIG. 1 to FIG. 18. FIG. 1 to FIG. 18 sequentially illustrate a patterning method for forming semiconductor features on a semiconductor substrate according to one embodiment of the invention. The upper portions of FIG. 1 to FIG. 18 are top views. The lower portion of FIG. 1 to FIG. 7 are cross-sectional views taken along line A-A' and line B-B' in the corresponding top views. The lower portion of FIG. 8 to FIG. 18 are cross-sectional views taken along line C-C' and line B-B' in the corresponding top views. According to an embodiment, line A-A' cuts through the array region 101 of the semiconductor structure 10 along a second direction X, and lines C-C' cuts through the array region 101 of the semiconductor substrate 10 along a first direction Y. The first direction Y and the second direction X may be perpendicular to each other as shown in the illustrated embodiment, or may not be perpendicular and have an included angle smaller than 90 degrees in other embodiments. Lines B-B' cuts through a peripheral region 102 of the semiconductor substrate 10 along the second direction X as shown in the illustrated embodiment, or may cut through the peripheral region 102 of the semiconductor substrate 10 along the first direction Y in other embodiments.

Please refer to FIG. 1. A semiconductor substrate 10 having a stacked film structure formed thereon is provided. The semiconductor substrate 10 may be a silicon substrate, an epitaxial silicon substrate, a silicon-germanium substrate, a silicon carbide substrate, or a silicon-on-insulator substrate, but not limited thereto. The semiconductor substrate 10 may be a substrate used for forming a DRAM device and have an array region 101 in that the memory cells are to be formed and a peripheral region 102 in that the peripheral circuits are to be formed defined thereon. The semiconductor substrate 10 may already have semiconductor structures such as transistors (not shown), word-lines (not shown) and bit-lines (not shown) formed therein. An interlayer dielectric layer 110 is formed on the semiconductor substrate 10. The material of the interlayer dielectric layer 110 may include silicon oxide, silicon nitride, but not limited thereto. According to one embodiment, a plurality of contact plugs 112 may be formed in the interlayer dielectric layer 110 in the array region 101 for electrically connecting to terminals of the transistors of the memory cells, and a plurality of contact plugs 114 may be formed in the interlayer dielectric layer 110 in the peripheral region for electrically connecting to the peripheral circuits. A target layer 120 is formed on the interlayer dielectric layer 110. The target layer 120 may comprise conductive material and is in direct contact with the contacts plugs 112 and the contact plugs 114. According to one embodiment, the contact plugs 112, the contact plugs 114 and the target layers 120 may include the same conductive material, such as tungsten or other suitable conductive materials, and may be formed integrally. According to the embodiment, the target layer 120 is to be patterned into storage node (SN) pads in the array region 101 and contact plug pads in the peripheral region 102 as would be illustrated in the following description.

Please still refer to FIG. 1. A pattern transferring layer L1 is then formed on the target layer 120. According to an embodiment, the pattern transferring layer L1 may have a multi-layered structure, comprising (from bottom to top) a hard mask layer 130, an advanced patterning film (APF) 140 and an anti-reflection layer 150. According to an embodiment, the hard mask layer 130 may comprise silicon nitride. The APF 140 may comprise amorphous carbon layer. The anti-reflection layer 150 may comprise silicon oxy-nitride (SiON). Subsequently, a hard mask layer 160 and a first material layer 170 are successively formed on the pattern transferring layer L1. The hard mask layer 160 is made of material having etching selectivity with respect to the first material layer 170. According to an embodiment, the hard mask layer 160 is made of silicon oxide and the first material layer 170 is made of polysilicon.

Figure 2:
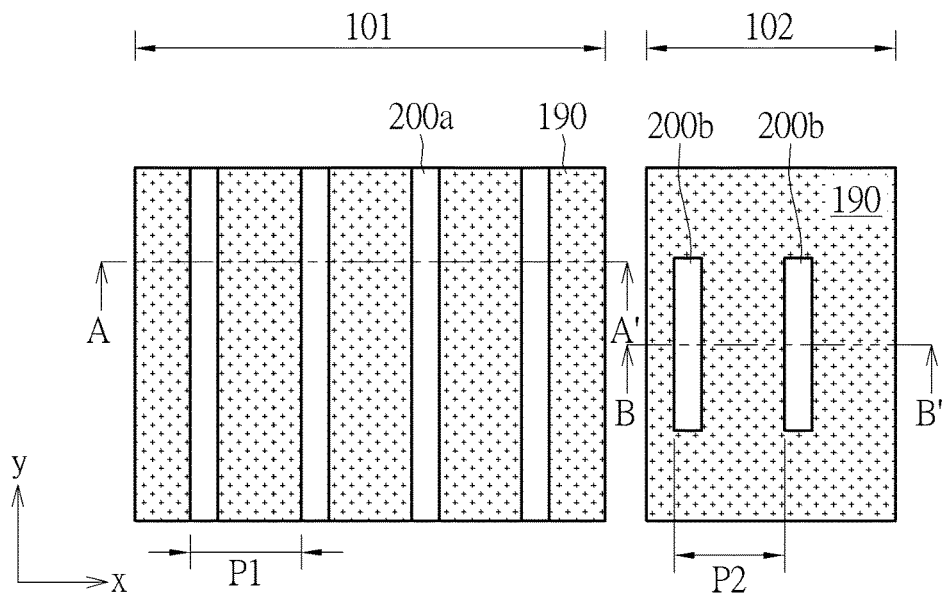
Figure 2:
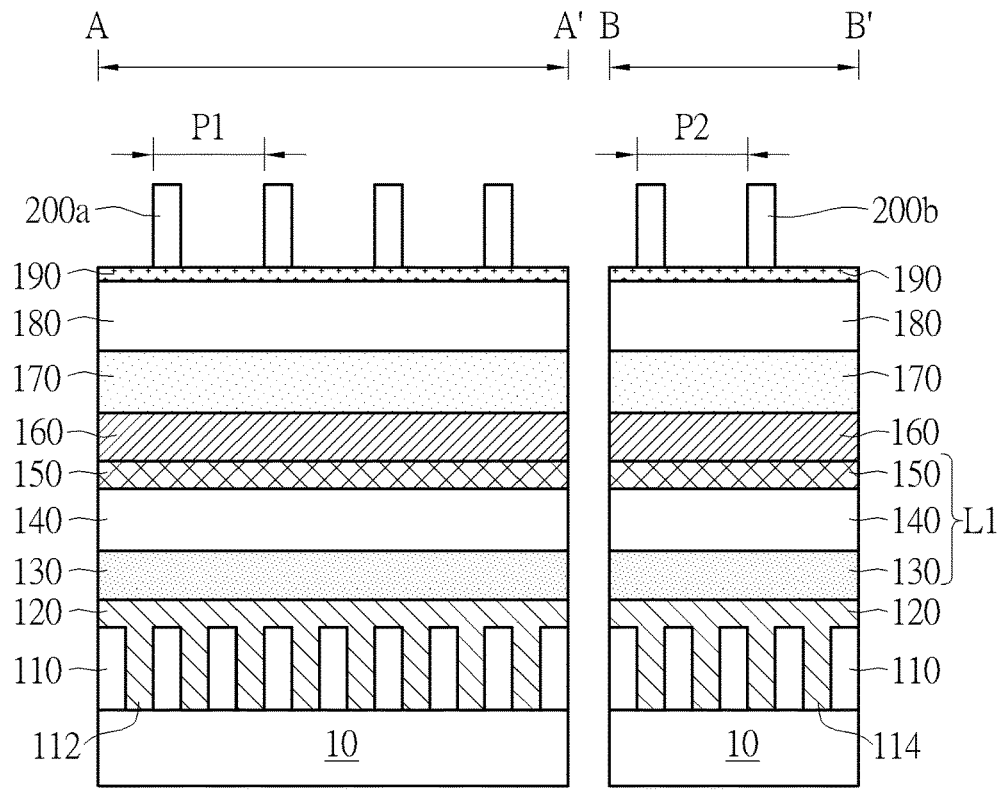
Figure 3:
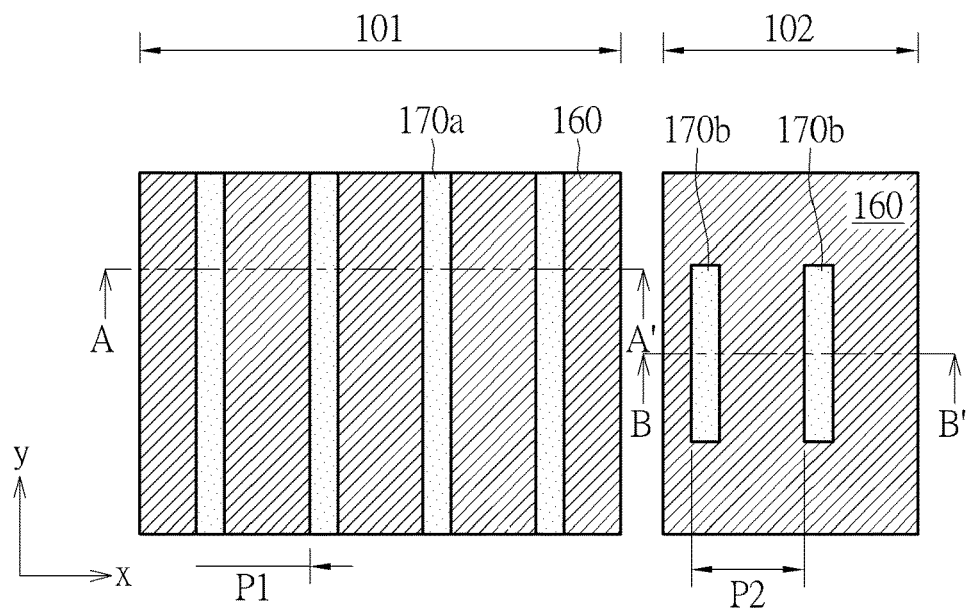
Figure 3:
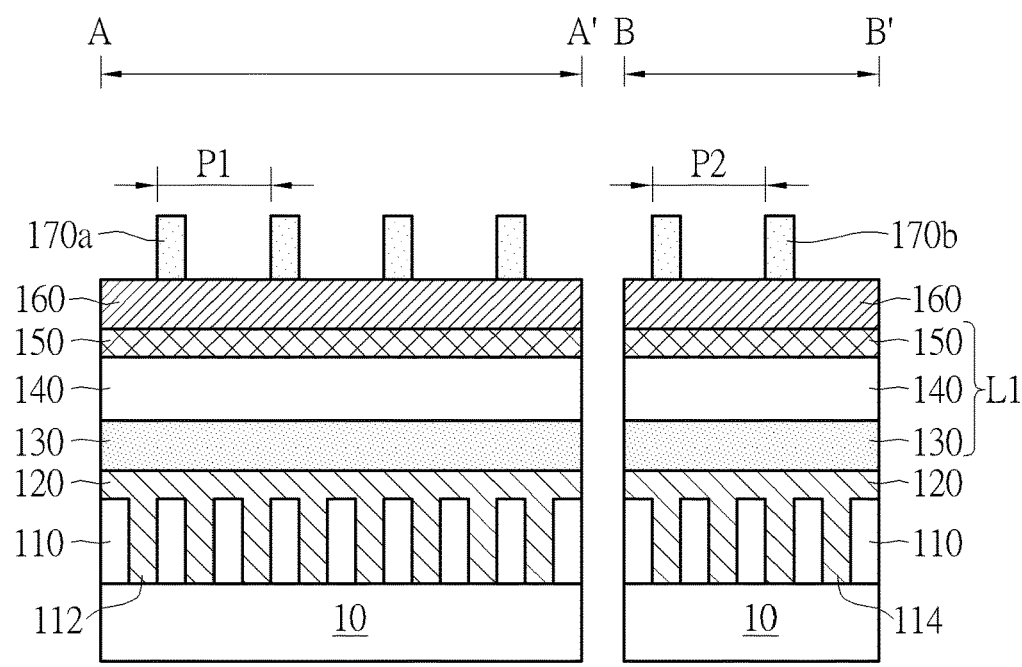

Please refer to FIG. 2 and FIG. 3. FIG. 2 and FIG. 3 illustrate the process of performing a first photolithography-etching process to pattern the first material layer 170 into first array patterns 170a in the array region 101 and first peripheral patterns 170b in the peripheral region 102, according to an embodiment. As shown in FIG. 2, the first photolithography-etching process may include sequentially forming an organic dielectric layer 180, an anti-reflection layer 190 and a photoresist layer 200 on the first material layer 170 in a blanket manner. A lithography process using a first photomask is then carried out to transfer the predetermined patterns from the first photomask to the photoresist layer 200 thereby forming the photoresist patterns 200a in the array region 101 and photoresist patterns 200b in the peripheral region 102. After that, as shown in FIG. 3, using the photoresist patterns 200a and the photoresist patterns 200b as an etching mask, the anti-reflection layer 190, the organic dielectric layer 180 and the first material layer 170 are etched, and therefore the patterns of the photoresist patterns 200a and the photoresist patterns 200b are concurrently transferred to the first material layer 170, respectively forming the first array patterns 170a in the array region 101 and the first peripheral patterns 170b in the peripheral region 102. After patterning the first material layer 170, the remaining photoresist patterns 200a and 200b, anti-reflection layer 190 and organic dielectric layer 180 are removed.

As shown in FIG. 3, according to an embodiment, the first array patterns 170a may be straight-line shaped features, extending lengthwisely along the first direction Y and separated from each other by a first pitch P1. According to an embodiment, the first peripheral patterns 170b may be straight-segment shaped features extending lengthwisely along the first direction Y and separated from each other by a second pitch P2. According to an embodiment, the first pitch P1 and the second pitch P2 are substantially the same. The extending directions of the first array patterns 170a and the first peripheral patterns 170b as shown in FIG. 3 are for illustratively only. It should be realized that in other embodiments, the first array patterns 170a and the first peripheral patterns 170b may extend along different directions. For example, the first array patterns 170a may extend along the first direction Y and the first peripheral patterns 170b may extend along the second direction X.

Subsequently, please refer to FIG. 4, FIG. 5, FIG. 6 and FIG. 7, which illustrate the process of performing a first self-aligned reverse patterning (SARP) to transfer the first array patterns 170a into the first spacer patterns 174.

Figure 4:
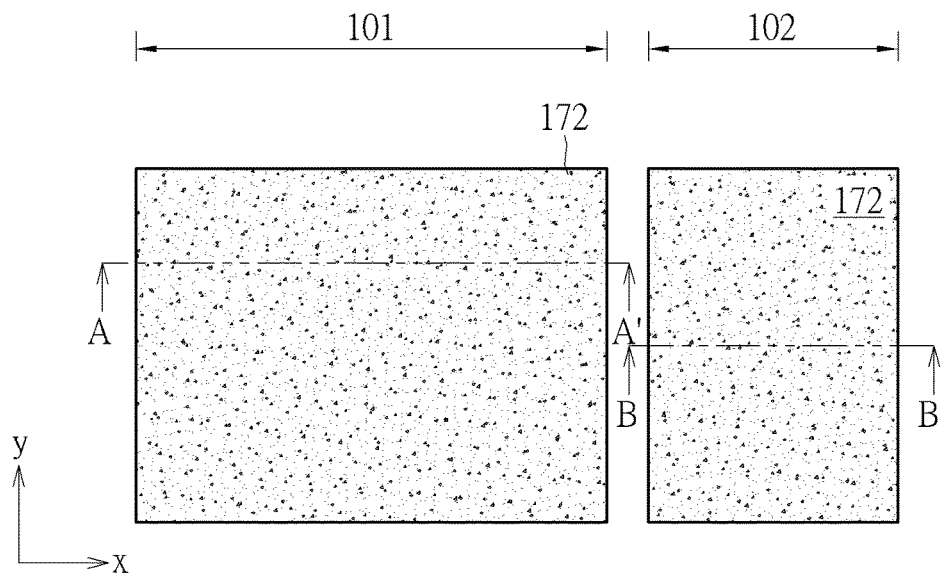
Figure 4:
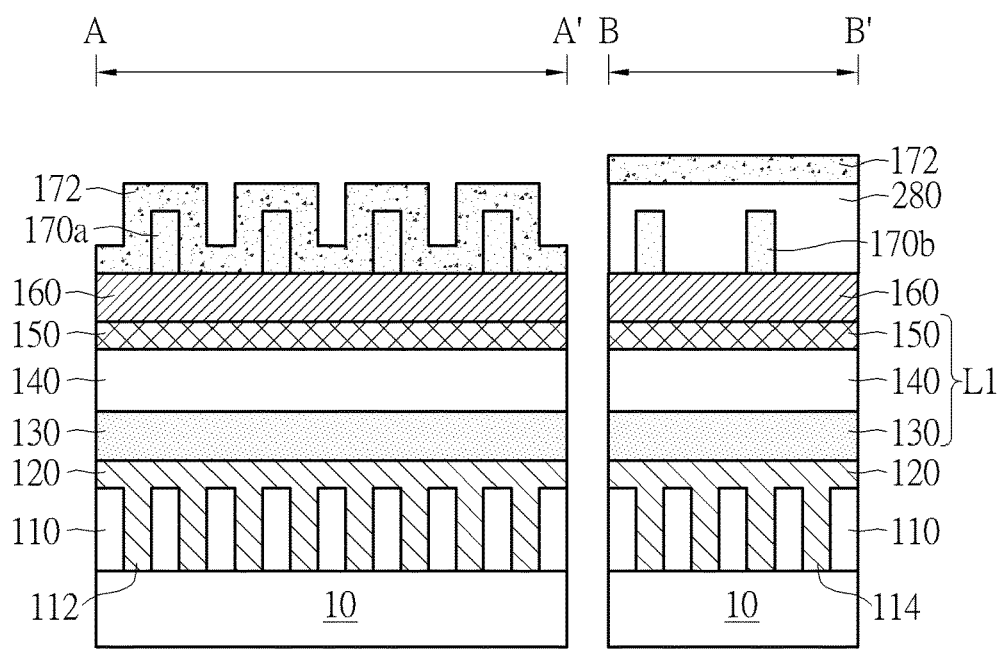
Figure 5:
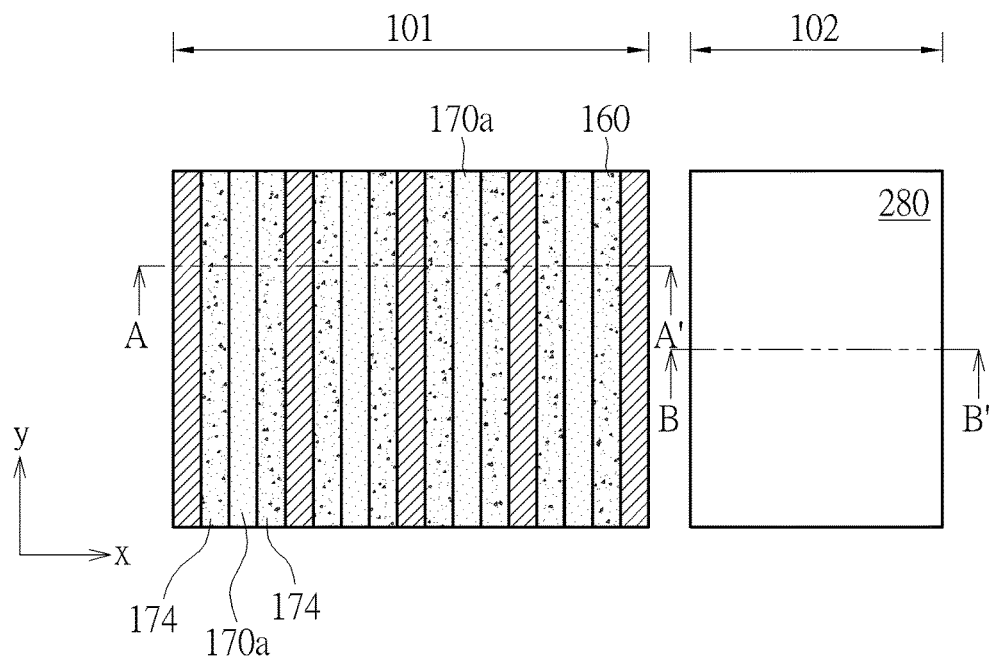
Figure 5:
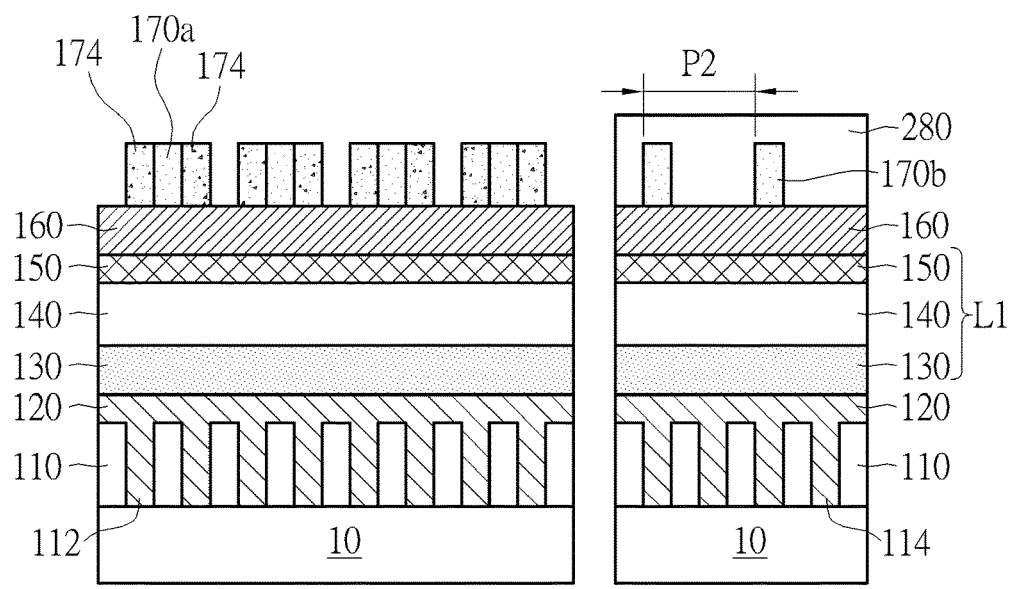
Figure 6:
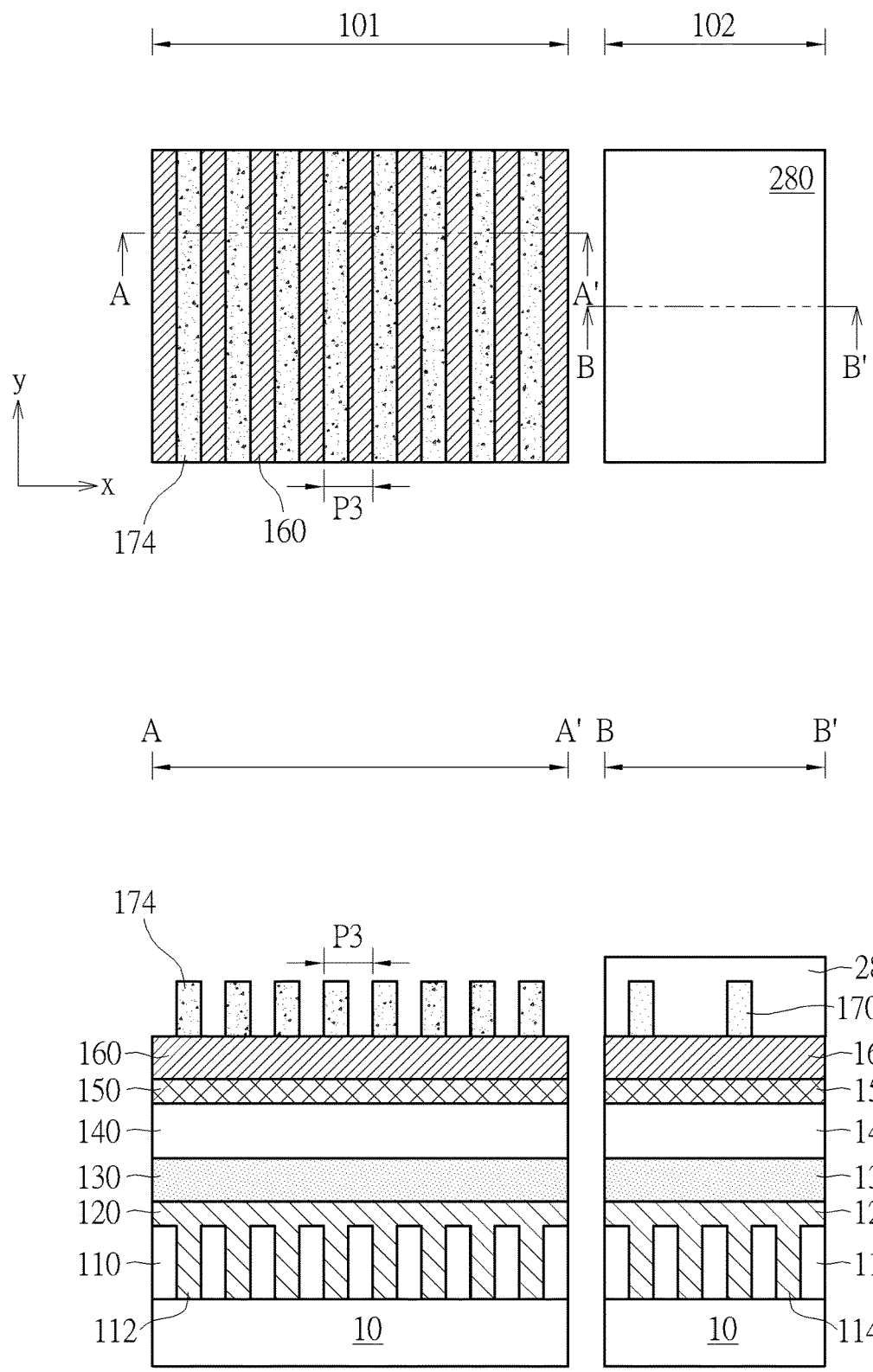
Figure 7:
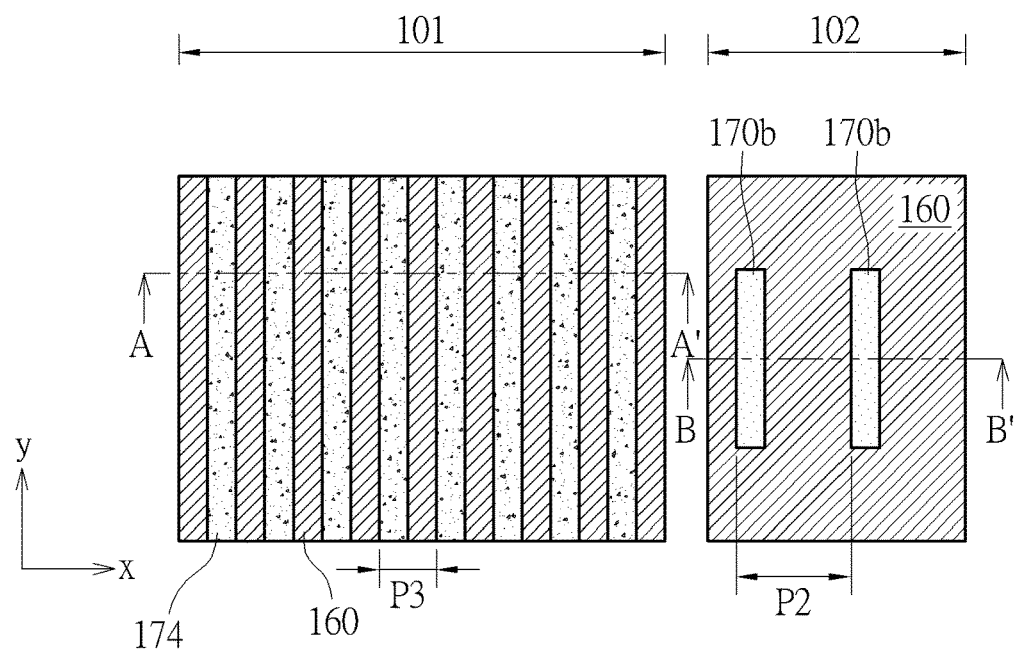
Figure 7:
Figure 7:
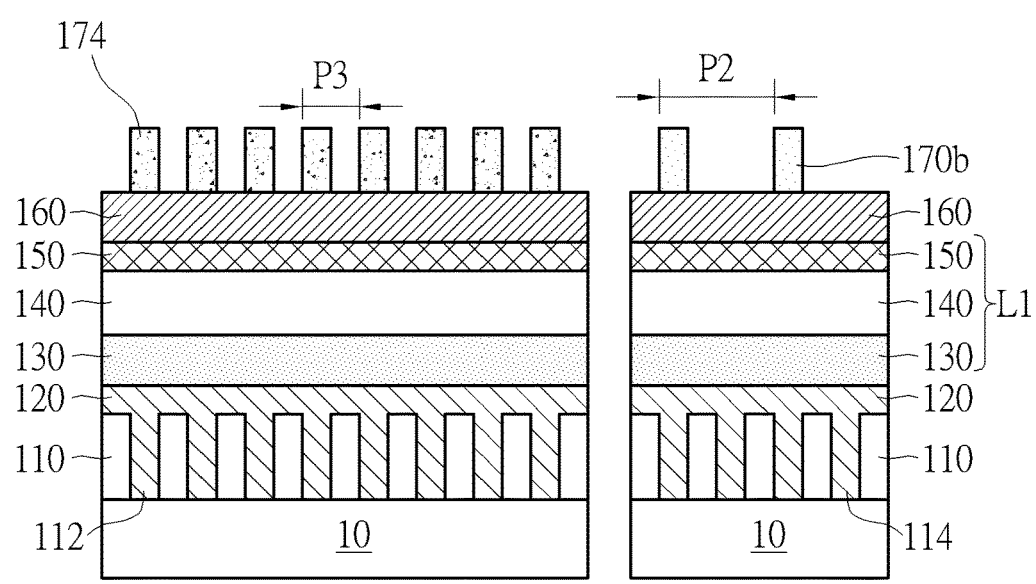

As shown in FIG. 4, a first covering layer 280 is formed in the peripheral region 102 and completely covering the first peripheral patterns 170b. The first covering layer 280 is not formed in the array region 101 and the first array patterns 170a are not covered by the first covering layer 280. After that, a first spacer material layer 172 is formed on the semiconductor substrate 10 in a blanket manner and conformally covering the first array patterns 170a and the first covering layer 280. The materials of the first spacer material layer 172, the first array patterns 170a, the hard mask layer 160 and the first covering layer 280 are different from each other and have etching selectivity with respect to each other. According to an embodiment, the first array patterns 170a are made of polysilicon, the hard mask layer 160 is made of silicon nitride, the first material layer 172 is made of silicon oxide, and the first covering layer 280 is made of organic dielectric material. Afterward, as shown in FIG. 5, an anisotropic etching process is performed to etch the first spacer material layer 172 until the first spacer material layer 172 only remains on the sidewalls of the first array patterns 170a and become the first spacer patterns 174. The first spacer patterns 174 are also straight-line shaped features extending along the same direction as the first array patterns 170a. Subsequently, as shown in FIG. 6, the first array patterns 170a between the first spacer patterns 174 are removed. The first peripheral patterns 170b are still covered by the first covering layer 280 and not removed when removing the first array patterns 170a. The first spacer patterns 174 on the hard mask layer 160 are spaced apart from each other by a third pitch P3. According to an embodiment, the third pitch P3 is substantially one-half of the first pitch P1. Please refer to FIG. 7. After removing the first array patterns 170a, the first covering layer 280 is removed and the first peripheral patterns 170b are exposed.

Figure 8:
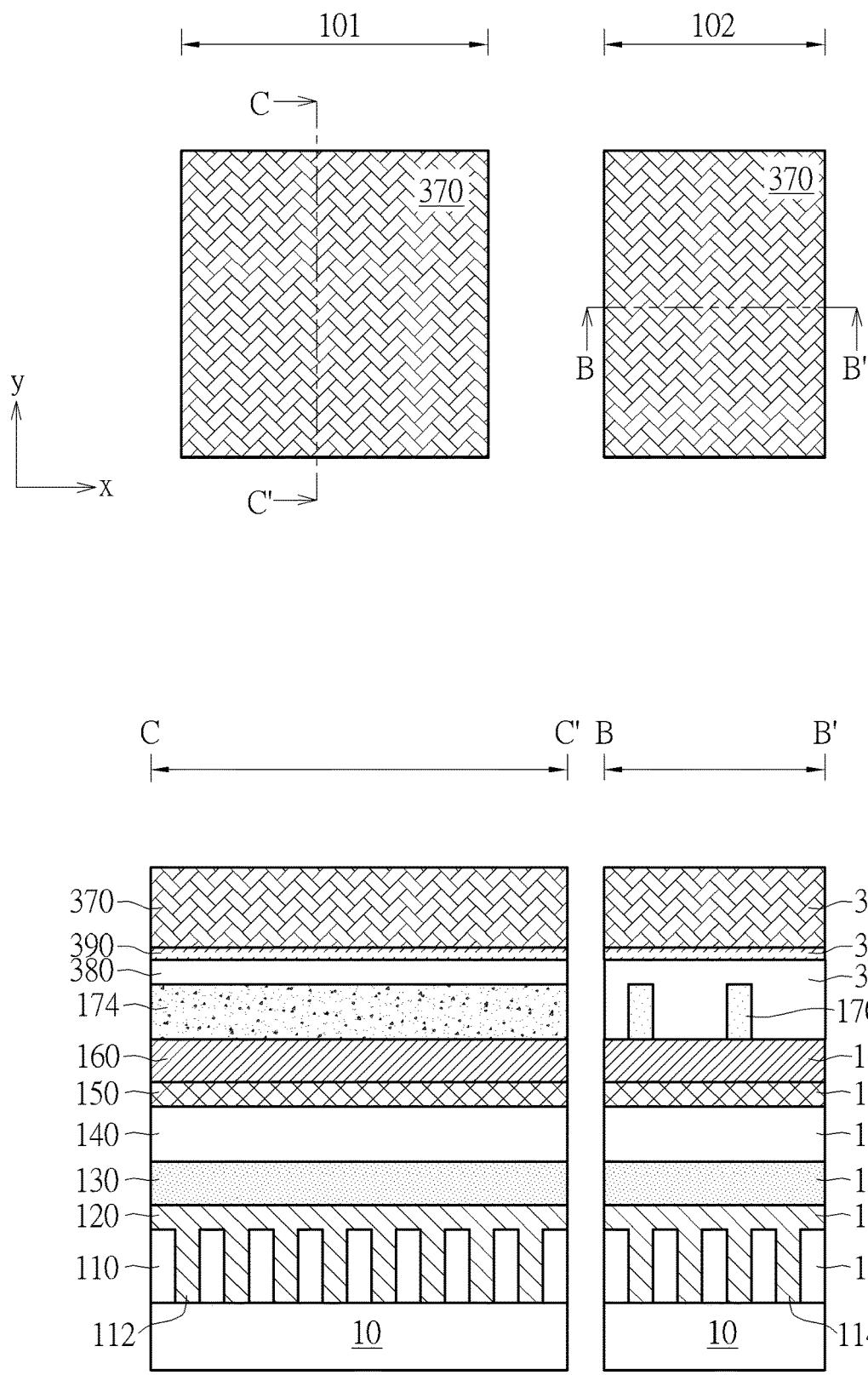

Please refer to FIG. 8. After removing the first covering layer 280, a planarization layer 380 is formed on the semiconductor substrate 10 in a blanket manner, completely covering the first spacer patterns 174 and the first peripheral patterns 170b and filling up the spaces between the first spacer patterns 174 and the first peripheral patterns 170b. The planarization layer 380 is to provide a planar top surface favorable for the subsequent process. Afterward, an anti-reflection layer 390 is formed on the planarization layer 380 and a second material layer 370 is formed on the anti-reflection layer 390. According to an embodiment, the planarization layer 380 may be made of organic dielectric material. According to an embodiment, the second material layer 370 is preferably made of the same material as the first material layer 170. For example, both of the first material layer 170 and the second material layer 370 comprise polysilicon. It should be understood that the cross-sectional view in the lower left portion of FIG. 8 (and subsequent FIGS. 9-18) is taken along line C-C' that is substantially along one of the straight-line shaped first array patterns 174. Therefore, the extending direction of the first array pattern 174 shown in the cross-sectional view is the lengthwise direction thereof.

Figure 9:
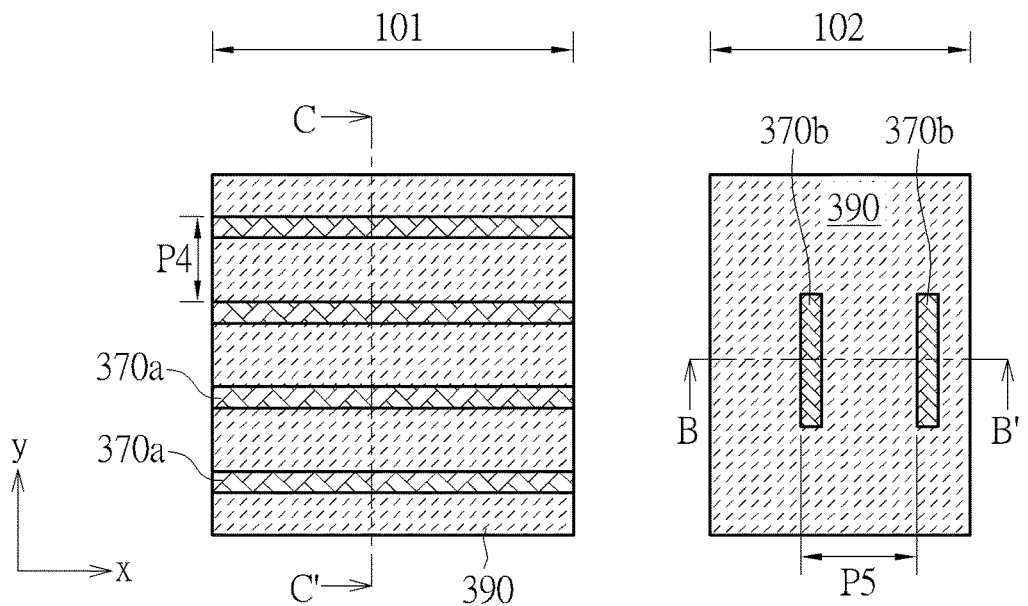
Figure 9:
Figure 9:
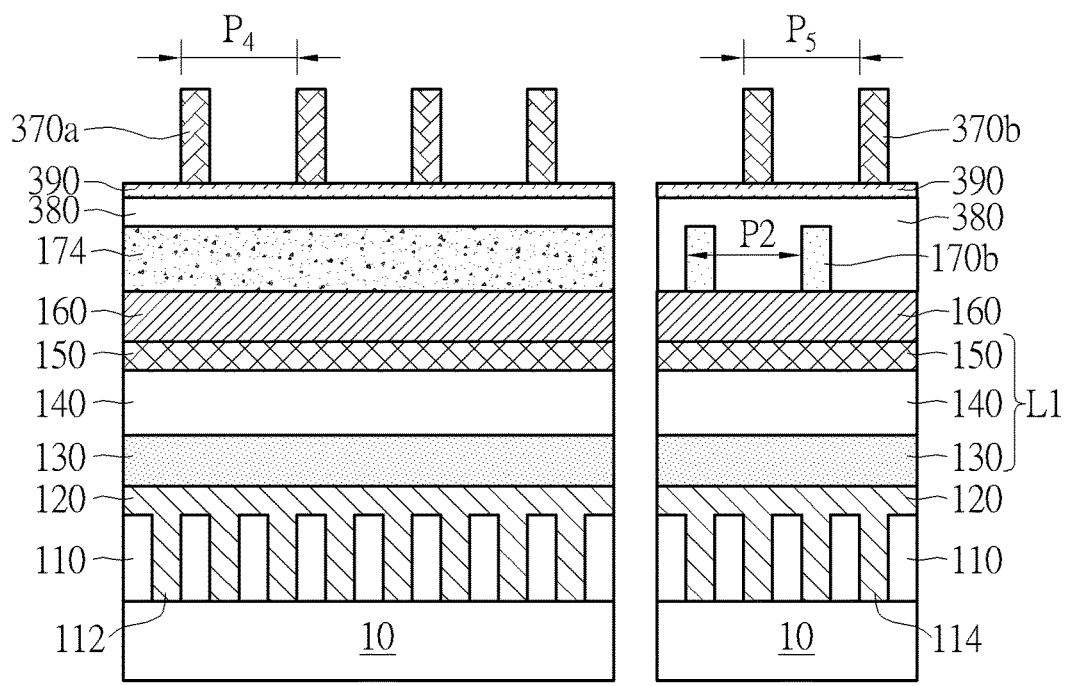

Please refer to FIG. 9. Similarly, a second photolithography-etching process is then performed to pattern the second material layer 370 into the second array patterns 370a in the array region 101 and the second peripheral patterns 370b in the peripheral region 102. The process of the second photolithography-etching process may be the same as the first photolithography-etching process as shown in FIG. 2 to FIG. 3 while a second photomask having the second pre-determined patterns is used to define the second array patterns 370a and the second peripheral patterns 370b concurrently. According to an embodiment, as shown in FIG. 9, the second array patterns 370a are straight-line shaped features extending lengthwisely along the second direction X and are separated from each other by a fourth pitch P4. According to an embodiment, the second peripheral patterns 370b are straight-segment shaped features extending lengthwisely along the same direction as the first peripheral patterns 170b and are separated from each other by a fifth pitch P5. According to an embodiment, the fourth pitch P4 and the fifth pitch are substantially the same. According to an embodiment, the first pitch P1, the second pitch P2, the fourth pitch P4 and the fifth pitch P5 are substantially the same.

Figure 10:
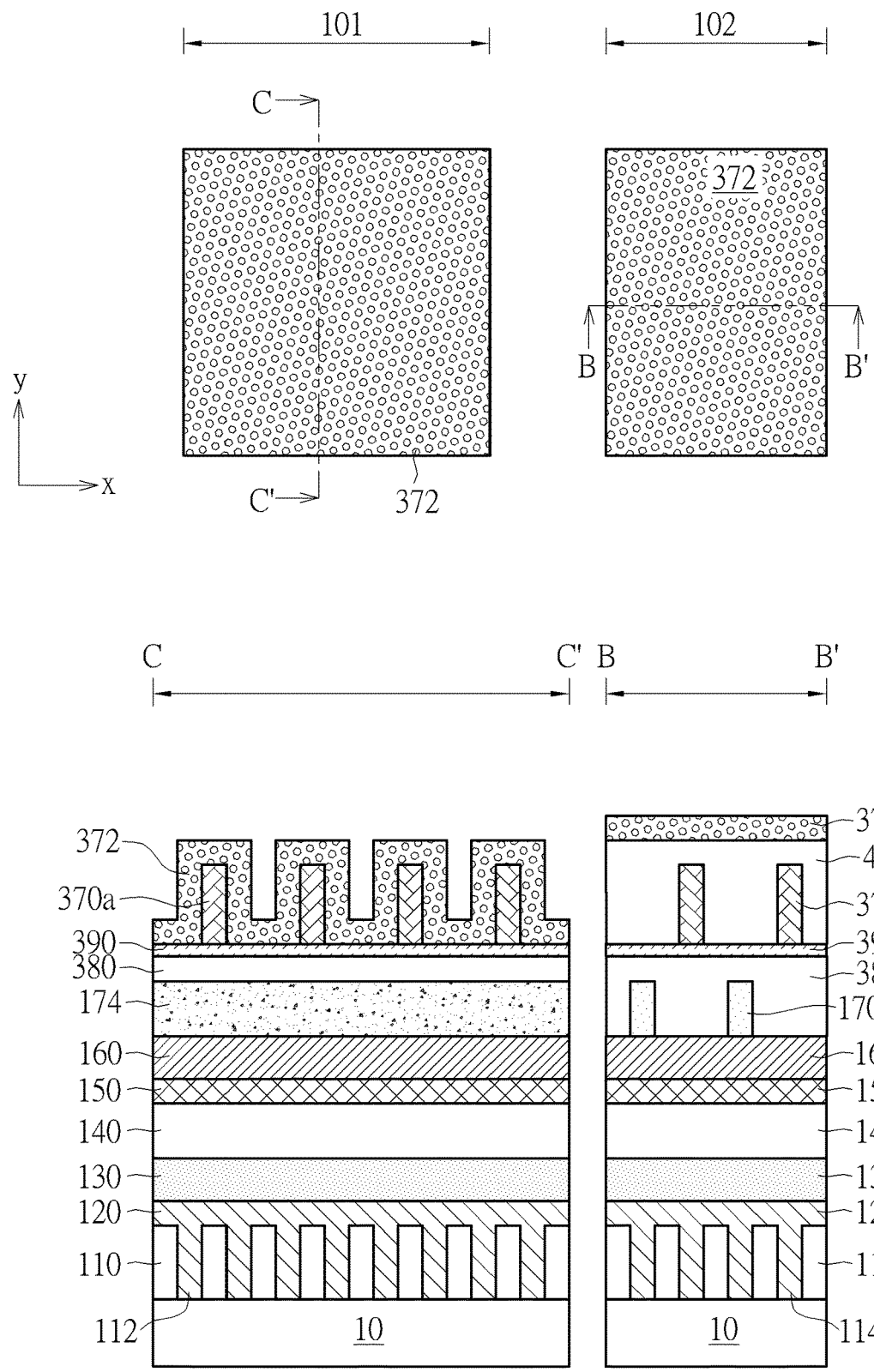
Figure 11:
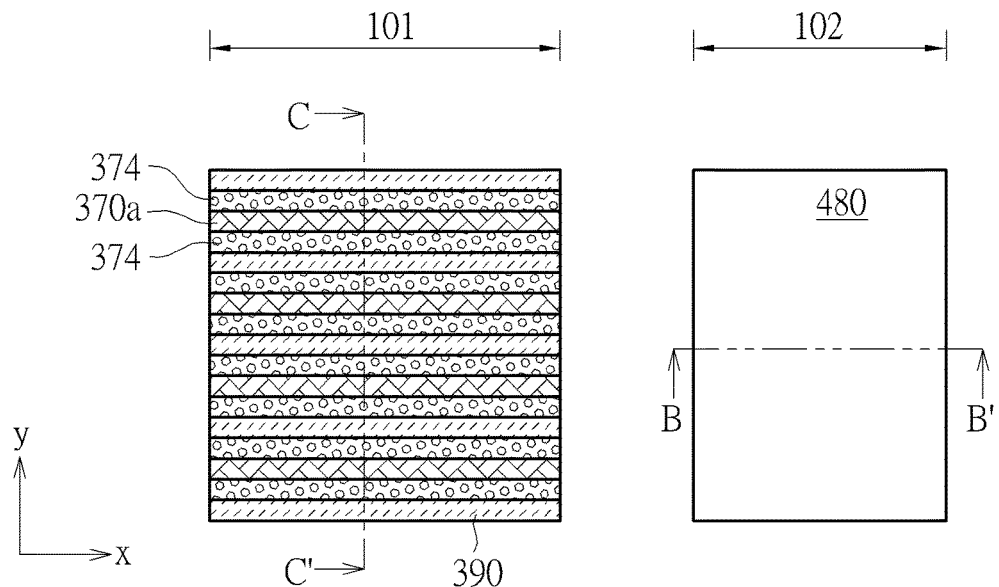
Figure 11:
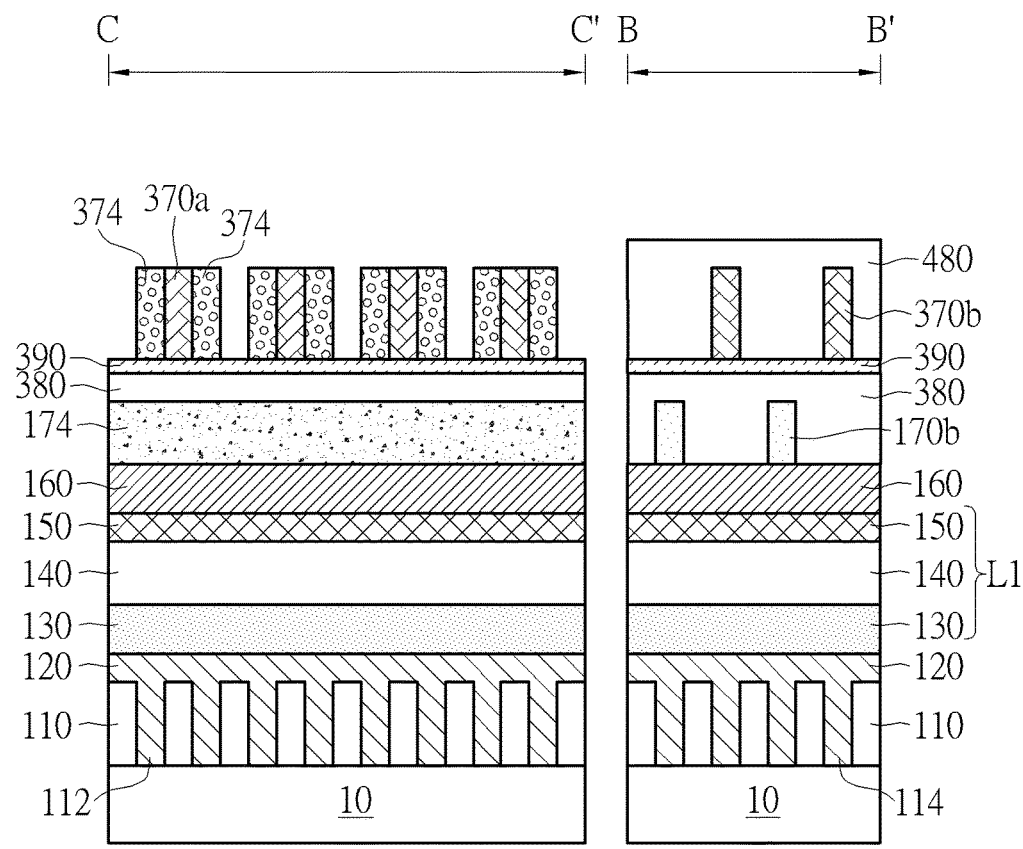
Figure 12:
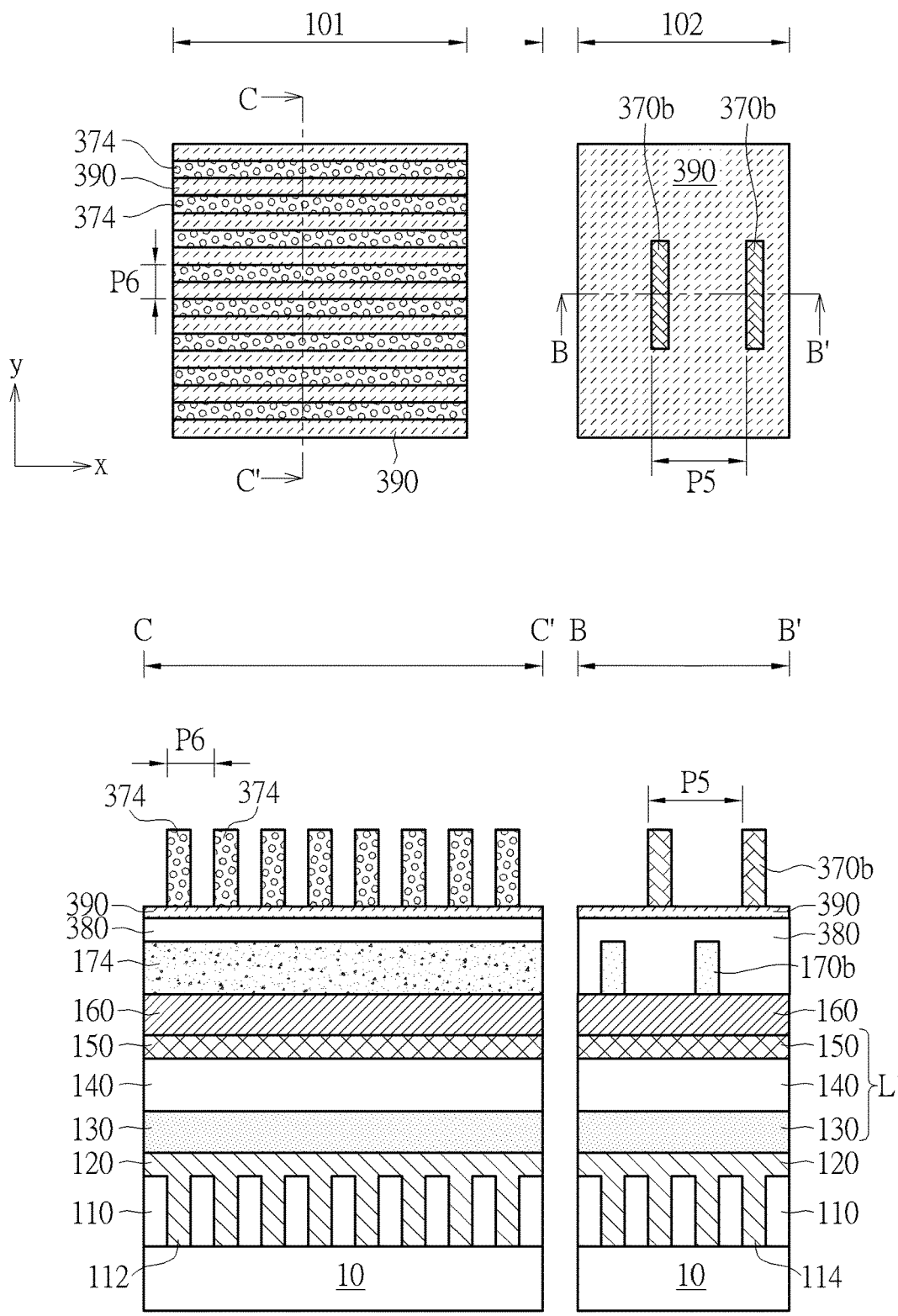

Subsequently, please refer to FIG. 10, FIG. 11 and FIG. 12, which illustrate the process of performing a second self-aligned reverse patterning (SARP) to transfer the second array patterns 370a into the second spacer patterns 374. According to an embodiment, as shown in FIG. 10, a second covering layer 480 (such as an organic dielectric layer) is formed in the peripheral region 102 and completely covering the second peripheral patterns 370b. The second covering layer 480 is not formed in the array region 101 and the second array patterns 370a are not covered by the second covering layer 480. After that, a second spacer material layer 372 is formed on the semiconductor substrate 10 in a blanket manner and conformally covering the second array patterns 370a and the second covering layer 480. The materials of the second spacer material layer 372, the second array patterns 370a, and the second covering layer 480 are different from each other and have etching selectivity with respect to each other. According to an embodiment, the second array patterns 170a are made of polysilicon, the second spacer material layer 372 is made of silicon oxide, and the second covering layer 480 is made of organic dielectric material. Afterward, as shown in FIG. 11, an anisotropic etching process is performed to etch the second spacer material layer 372 until the second spacer material layer 372 only remains on the sidewalls of the second array patterns 370a and become the second spacer patterns 374. The second spacer patterns 374 are also straight-line shaped features extending along the same direction as the second array patterns 370a. Subsequently, as shown in FIG. 12, the second array patterns 370a between the second spacer patterns 374 are removed while the second peripheral patterns 370b are still covered by the second covering layer 480. After removing the second array patterns 370a, the second covering layer 480 is removed and the second peripheral patterns 370b are exposed. The second spacer patterns 374 are spaced apart from each other by a sixth pitch P6. According to an embodiment, the sixth pitch P6 is substantially one-half of the fourth pitch P4. It is noteworthy that, as shown in the cross-sectional view in the lower portion of FIG. 12, the first spacer patters 174 and the second spacer patterns 374 are partially vertically overlapped, and the first peripheral patterns 170b and the second peripheral patterns 370b are not vertically overlapped. The term "vertically" means along the direction substantially perpendicular to the surface of the semiconductor substrate 10 on that the previously illustrated films and patterns are formed. It should be realized that the overlaying of the second spacer patterns 374 and the first spacer patterns 174 form a checkerboard pattern from the top view, and the overlaying of the second peripheral patterns 370b and the first peripheral patterns 170b form a grating pattern from the top view, having the second peripheral patterns 370b and the first peripheral patterns 170b alternately arranged.

Figure 13:
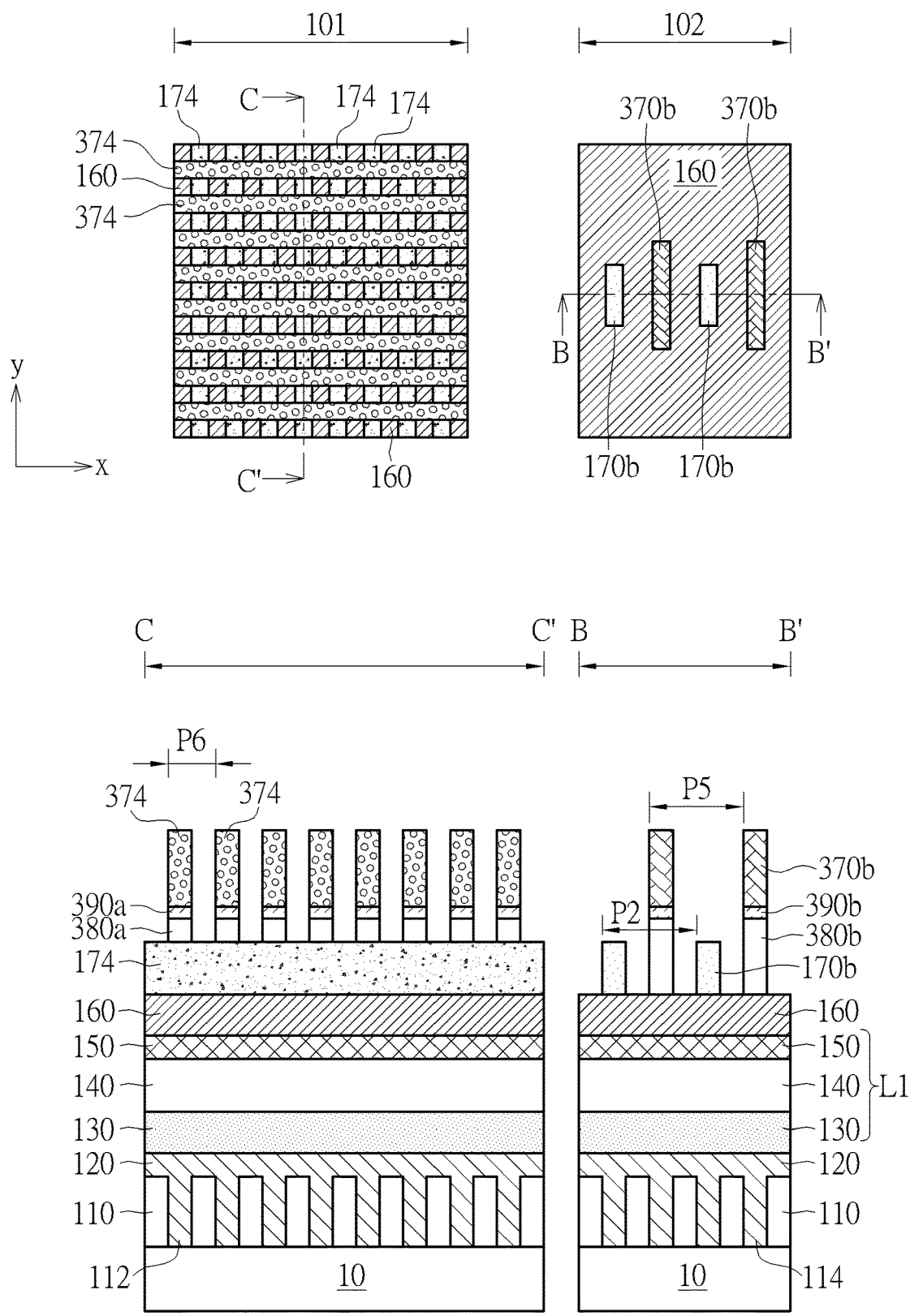

Please refer to FIG. 13. Subsequently, using the second spacer patterns 374 and the second peripheral patterns 370b as an etching mask, the anti-reflection layer 390 and the planarization layer 380 are etched until the hard mask layer 160, the first spacer patterns 174 and the first peripheral patterns 170b are exposed. The anti-reflection layer 390 and the planarization layer 380 covered by the second spacer patterns 374 and the second peripheral patterns become the patterned anti-reflection layers 390a, 390b and the patterned planarization layers 380a, 380b. It is noteworthy that, as shown in FIG. 13, the first peripheral patterns 170b on the hard mask layer 160 are completely exposed.

Figure 14:
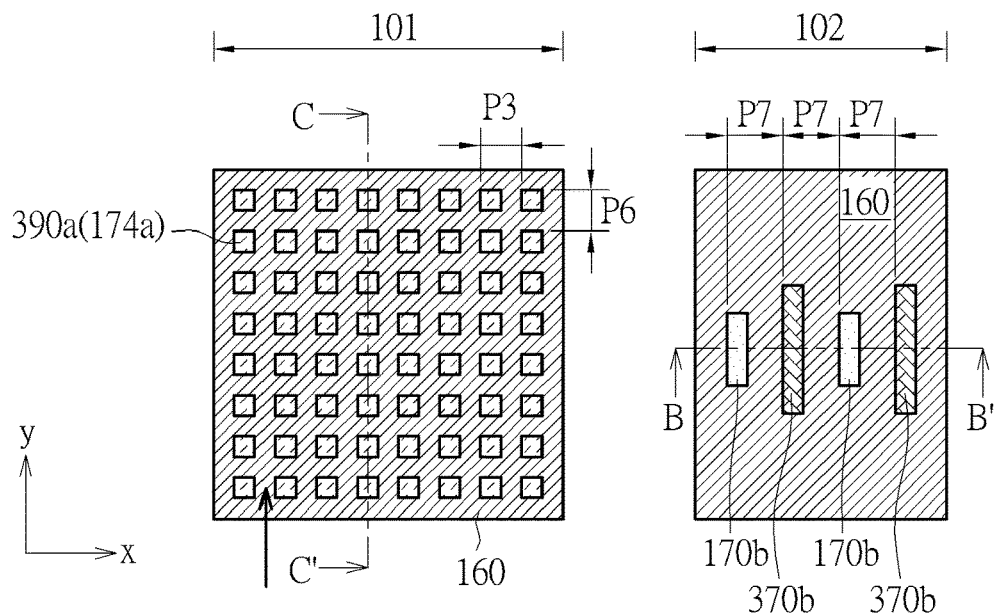
Figure 14:
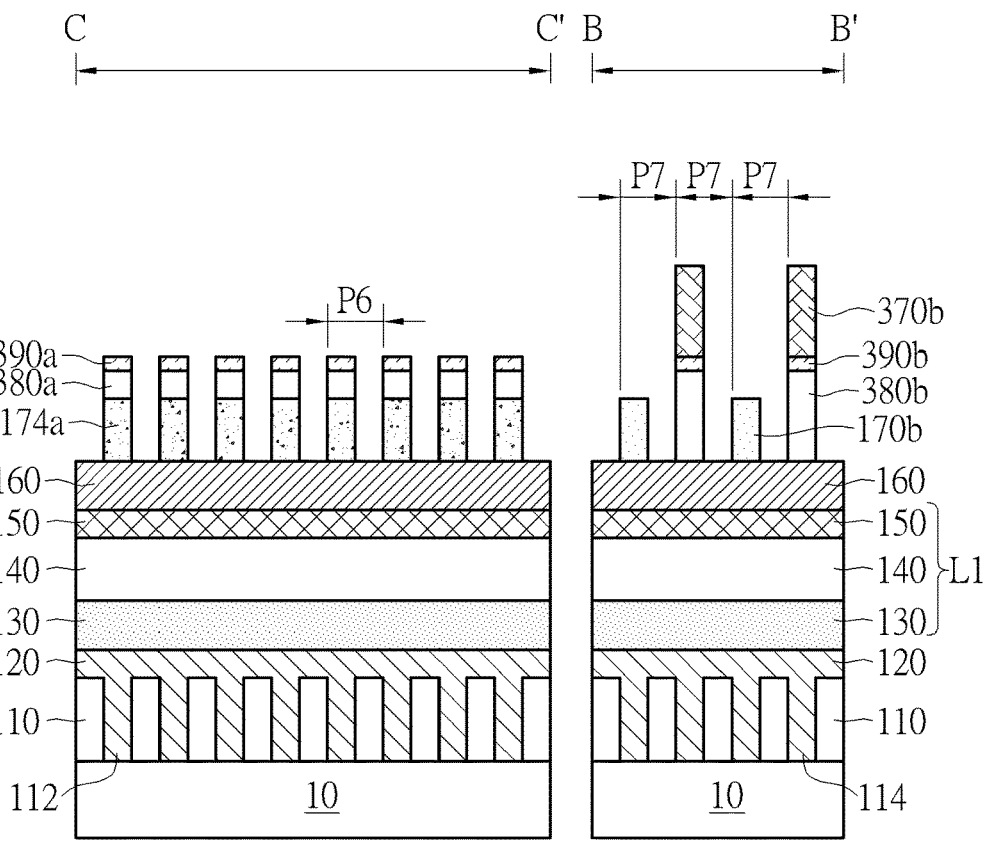

Please refer to FIG. 14. Subsequently, using the second spacer patterns 374 as an etching buffer layer, an removal process is performed to etch the second spacer patterns 374 and the first spacer patterns 174 not covered by the second spacer patterns 374 simultaneously until portions of the first spacer patterns 174 not covered by the second spacer patterns 374 are completely removed, thereby cutting the first spacer patterns 174 into discrete island shaped third array patterns 174a. It is important that the removal process preferably uses etchant having a high etching rate with respect to the first spacer patterns 174 and the second spacer patterns 374 (such as silicon oxide), the anti-reflection layer 390 (such as oxy-nitride) and the planarization layer 380 (such as organic dielectric layer), and having a low etching rate with respect to the first peripheral patterns 170b and the second peripheral patterns 370b (such as polysilicon). Furthermore, by adjusting the process parameters of the removal process, the removal process is highly anisotropic to prevent the lateral removal of the anti-reflection layer 390b and the planarization layer 380b under the second peripheral patterns 370b. More particularly, the removal process etches away the portion of the first spacer patterns 174 not covered by the second spacer patterns 374 and the second spacer patterns 374 at the same time from tops to bottoms in a highly anisotropic manner. The removal process continues until the following two situations are achieved. First, the portions of the first spacer patterns 174 not covered by the second spacer patterns 374 are completely removed and the underlying hard mask layer 160 is exposed. Second, the second spacer patterns 374 as the etching buffer layer are also completely removed and the underlying anti-reflection layer 390a and the planarization layer 380a are exposed. The anti-reflection layer 390a and the planarization layer 380a are then removed until the planarization layer 380a filling in the spaces between the third array patterns 174a (such as the space and its equivalent the arrow in FIG. 14 indicated which is originally covered under the second spacer patterns 374) is completely removed. It is noteworthy that by adjusting the removal process to be highly anisotropic and having low etching rate with respect to the second peripheral patterns 370b, the anti-reflection layer 390b and the planarization layer 380b in the peripheral region 102 may not be etched by being protected by the second peripheral patterns 370b that is hardly etched by the removal process. After the removal process, some anti-reflection layer 390a and planarization layer 380a may be remained on tops of the third array patterns 174a. In other embodiments, the anti-reflection layer 390a and planarization layer 380a on the tops of the third array patterns 174a may be completely removed.

Please still refer to FIG. 14. At this process stage, the hard mask layer 160 in the array region 101 is partially covered by the third array patterns 174a, and the hard mask layer 160 in the peripheral region 102 is partially covered by the first peripheral patterns 170b and the stack structures of the planarization layer 380b, the anti-reflection layer 390b and the second peripheral patterns 370b. As shown in the top view in the upper portion of FIG. 14, the third array patterns 174a are arranged into an array along the first direction Y and the second direction X and are spaced apart from each other by the pitch P3 along the second direction X and by the pitch P6 along the first direction Y. The first peripheral patterns 170b and the second peripheral patterns 370b are alternately arranged along the second direction X to form a grating pattern and are spaced apart from each other by the seventh pitch P7. According to an embodiment, the seventh pitch P7 substantially equals to one-half of the second pitch P2 and also equals to one-half of the fifth pitch P5. It is noteworthy that the second peripheral patterns 370b are at a horizontal level higher than the first peripheral patterns 170b for being on the tops of the anti-reflection layer 390b and the planarization layers 380b.

Figure 15:
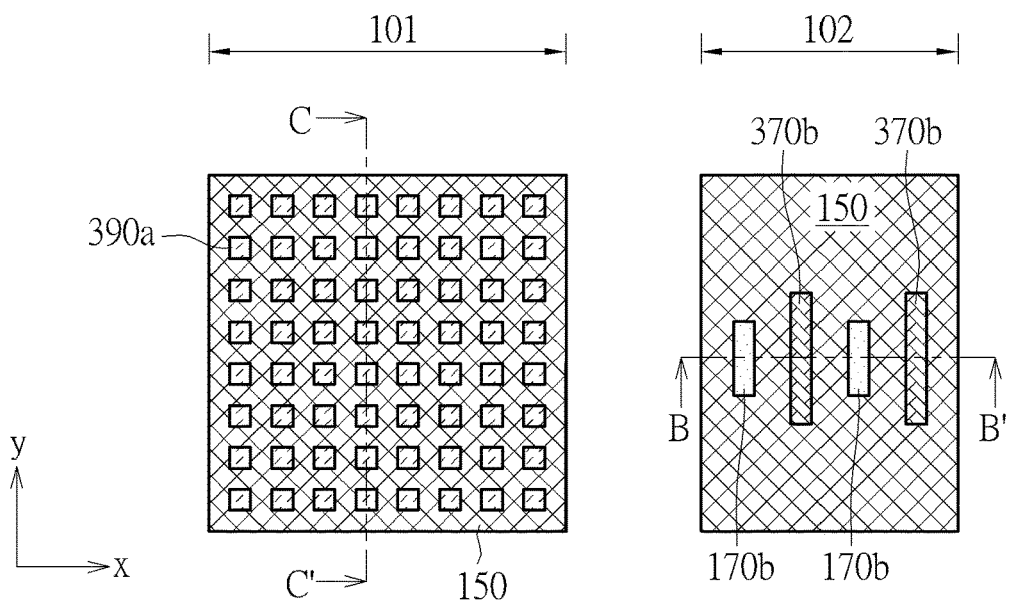
Figure 15:
Figure 15:
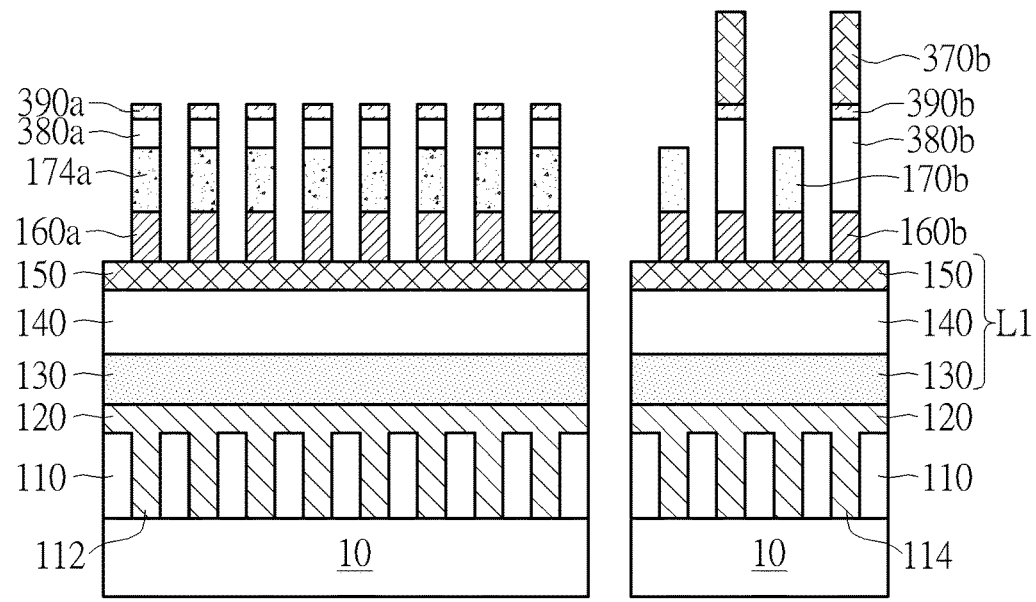

Please refer to FIG. 15. Subsequently, the hard mask layer 160 is etched using the third array patterns 174a, the first peripheral patterns 170b and the second peripheral patterns 370b as an etching mask, and the patterns of the third array patterns 174a, the first peripheral pattern 170b and the second peripheral patterns 370b are therefore concurrently transferred into the hard mask layer 160 and a patterned hard mask layer comprising the array hard mask patterns 160a in the array region 101 and the peripheral hard mask patterns 160b in the peripheral region 102 is obtained.

Figure 16:
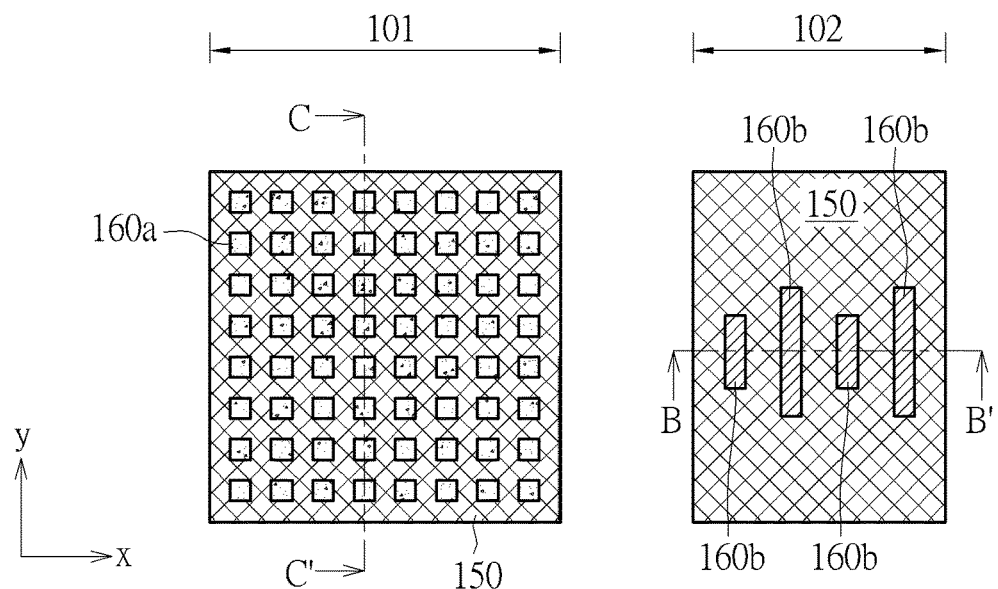
Figure 16:
Figure 16:
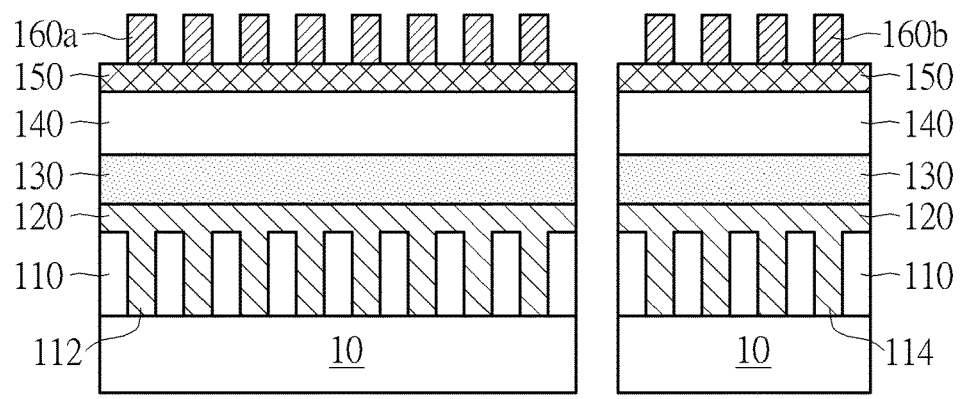
Figure 17:
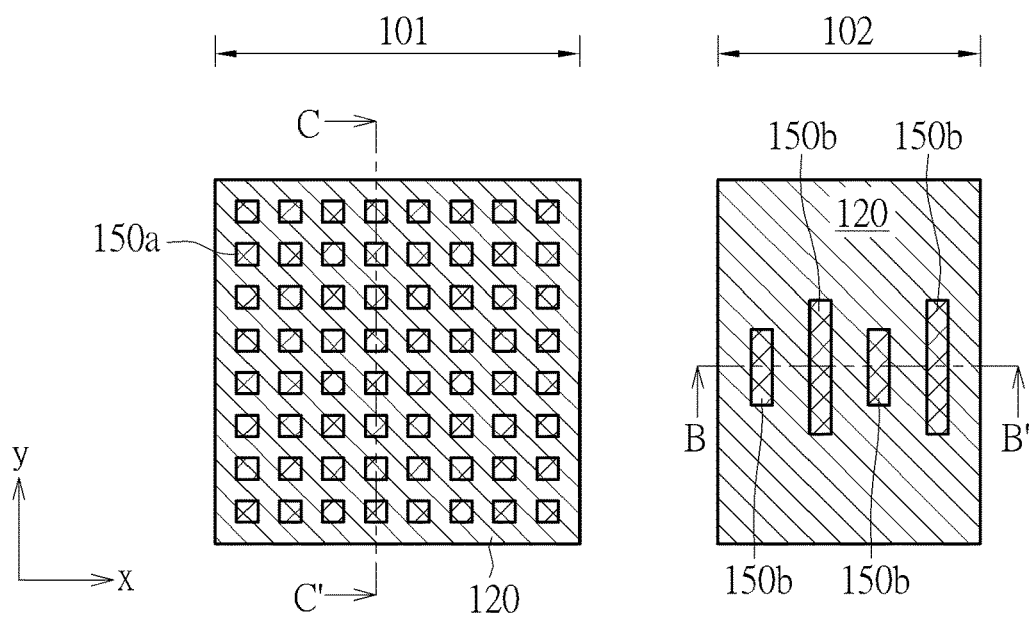
Figure 17:
Figure 17:
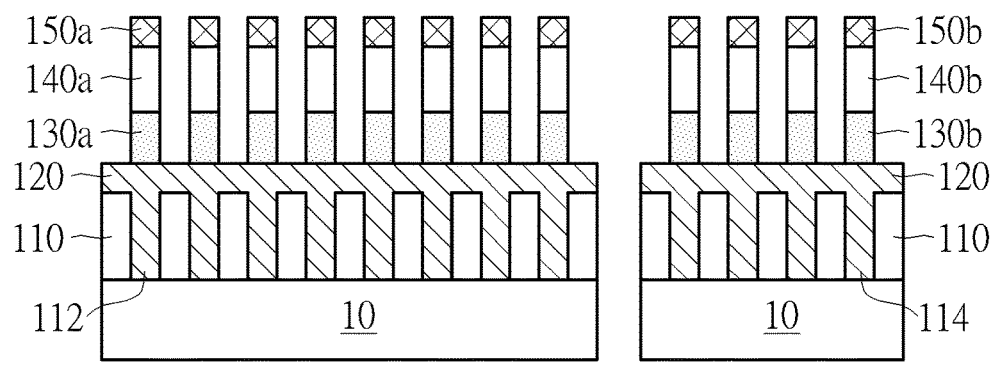
Figure 18:
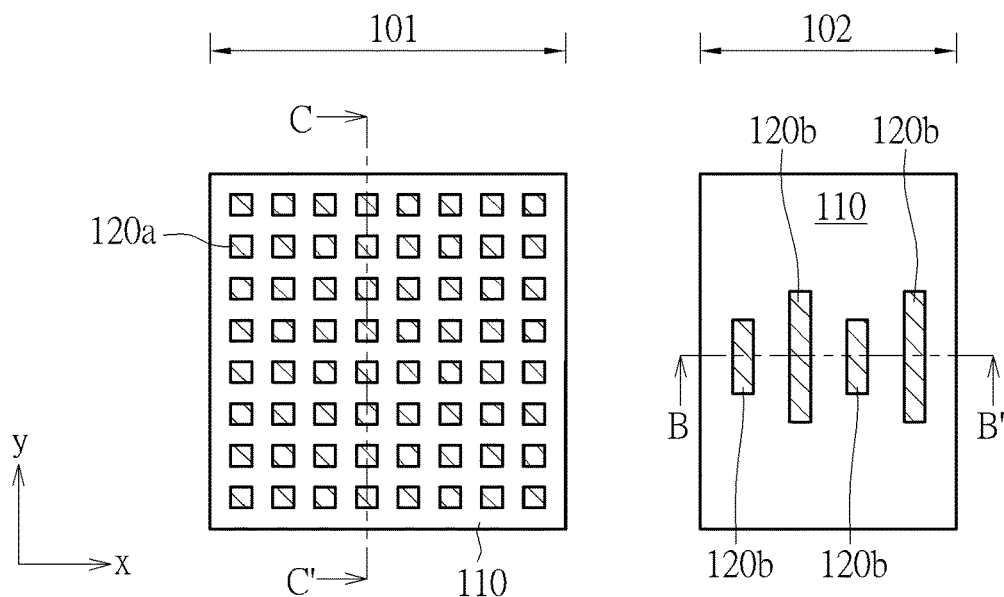
Figure 18:
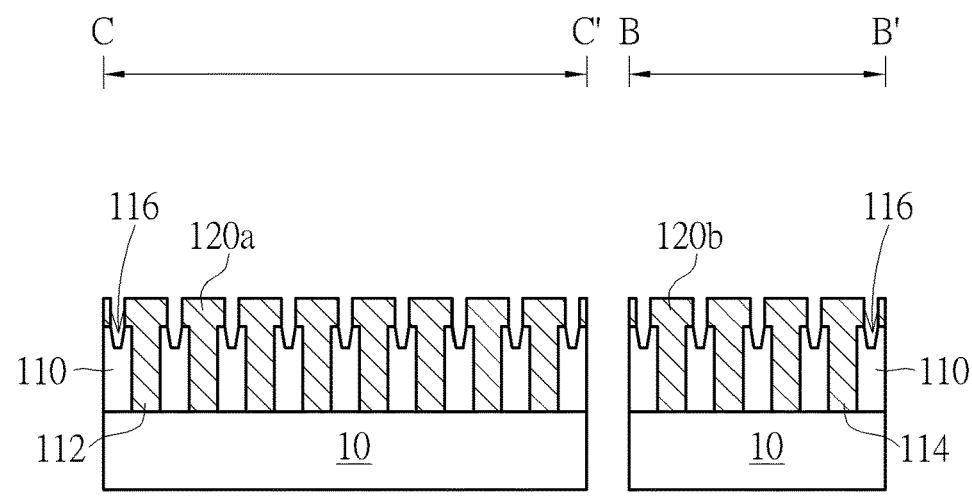

Please refer to FIG. 16, FIG. 17 and FIG. 18, which illustrate the process of transferring the patterns of the patterned hard mask layer into the target layer 120 to simultaneously form the target array patterns 120a in the array region 101 and the target peripheral patterns 120b in the peripheral region 102.

As shown in FIG. 16, after patterning the hard mask layer 160 into the array hard mask patterns 160a and the peripheral hard mask pattern 160b, the remaining third array patterns 174a, first peripheral patterns 170b, second peripheral patterns 370b, anti-reflection layers 390a, 390 and planarization layers 380a, 380b may be removed. After that, as shown in FIG. 17, using the array hard mask patterns 160a and the peripheral hard mask patterns 160b as an etching mask to etch the pattern transferring layer L1, the patterns of the array hard mask patterns 160a and the peripheral hard mask patterns 160b are simultaneously transferred into each layer of the pattern transferring layer L1, forming the anti-reflection layers 150a and 150b, the advanced patterning films 140a and 140b, the and hard mask layers 130a and 130b. Following, as shown in FIG. 18, using the advanced patterning films 140a, 140b and the hard mask layers 130a, 130b of the patterned pattern transferring layer L1 as an etching mask to etch the target layer 120, the patterns is further transferred into the target layer 120 to form the target array patterns 120a in the array region 101 and the target peripheral patterns 120b in the peripheral region 102. Afterward, the remaining patterned pattern transferring layer L1 on the target array patterns 120a and the target peripheral patterns 120b may be removed. According to an embodiment, the process of etching the target layer 120 may form recesses 116 in the interlayer dielectric layer 110 exposed between the target array patterns 120a and the target peripheral patterns 120b to ensure the isolation between each of the target array patterns 120a and the target peripheral patterns 120b. According to an embodiment, the target array patterns 120a in the array region 101 may function as the storage node pads for connecting the capacitors (not shown) of the memory cells. The target peripheral patterns 120b may function as the contact plug pads for connecting the metal interconnections (not shown).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A patterning method, comprising:
    providing a substrate having a hard mask layer formed thereon, wherein an array region and peripheral region are defined on the substrate;
    forming a first material layer on the hard mask layer;
    patterning the first material layer to form first array patterns in the array region and first peripheral patterns in the peripheral region;
    performing a first self-aligned reverse patterning (SARP) process to transfer the first array pattern into first spacer patterns;
    forming a planarization layer completely covering the first spacer patterns and the first peripheral patterns;
    forming a second material layer on the planarization layer;
    patterning the second material layer to form second array patterns in the array region and second peripheral patterns in the peripheral region;
    performing a second self-aligned reverse patterning (SARP) process to transfer the second array pattern into second spacer patterns, wherein the second spacer patterns partially vertically overlap the first spacer patterns, wherein the second peripheral patterns do not vertically overlap the first peripheral pattern;
    using the second spacer patterns and the second peripheral patterns as an etching mask to etch the planarization layer until portions of the first spacer patterns not overlapped by the second spacer patterns and the first peripheral patterns are exposed;
    removing the exposed portions of the first spacer patterns to form third array patterns; and
    using the third array patterns, the second peripheral patterns and the first peripheral patterns as an etching mask to etch the hard mask layer thereby forming a patterned hard mask layer.

2. The patterning method according to claim 1, wherein the first array patterns are straight-line shaped features extending along a first direction, the second array patterns are straight-line shaped features and extending along a second direction.

3. The patterning method according to claim 2, wherein the first direction and the second direction are perpendicular.

4. The patterning method according to claim 2, wherein the first direction and the second direction define an included angle smaller than 90 degrees.

5. The patterning method according to claim 2, wherein the first peripheral patterns and the second peripheral patterns extend along the same direction that is either the first direction or the second direction.

6. The patterning method according to claim 5, wherein the first peripheral patterns and the second peripheral patterns are alternately arranged.

7. The patterning method according to claim 2, wherein the first SARP process comprising:
    forming a first covering layer covering the first peripheral patterns;
    forming a first spacer material layer conformally covering the first array patterns and the first covering layer;
    etching the first spacer material layer to form first spacer patterns on sidewalls of the first array patterns; and
    removing the first array patterns and the first covering layer.

8. The patterning method according to claim 2, wherein the second SARP process comprising:
    forming a second covering layer covering the second peripheral patterns;
    forming a second spacer material layer conformally covering the second array patterns and the second covering layer;
    etching the second spacer material layer to form second spacer patterns on sidewalls of the second array patterns; and
    removing the second array patterns and the second covering layer.

9. The patterning method according to claim 1, wherein the second spacer patterns are also removed when removing the exposed portions of the first spacer patterns.

10. The patterning method according to claim 1, wherein the third array patterns are island shaped features.

11. The patterning method according to claim 1, wherein the first material layer and the second material layer are made of a same material, and the first spacer patterns and the second spacer patterns are made of a same material that is different from that of the first material layer and the second material layer.

12. The patterning method according to claim 11, wherein the first material layer and the second material layer are made of polysilicon, and the first spacer patterns and the second spacer patterns are made of silicon oxide.

13. The patterning method according to claim 1, wherein the planarization layer is an organic dielectric layer.

14. The patterning method according to claim 1, wherein the hard mask layer is made of silicon nitride.

15. The patterning method according to claim 1, further comprising using the patterned hard mask layer as an etching mask to etch a target layer on the substrate.

16. The patterning method according to claim 15, wherein the target layer is made of metal.

* * * * *